United States Patent [19]
Haines

[11] Patent Number: 4,835,479
[45] Date of Patent: May 30, 1989

[54] APPARATUSES FOR TESTING MULTI-CORE CABLES FOR LEAKAGE BETWEEN CORES

[76] Inventor: Gerald J. Haines, 526 East Coast Road, No. 16-04, Singapore 1545, Singapore

[21] Appl. No.: 17,251
[22] PCT Filed: Jun. 2, 1986
[86] PCT No.: PCT/GB86/00308
§ 371 Date: Mar. 30, 1987
§ 102(e) Date: Mar. 30, 1987
[87] PCT Pub. No.: WO86/07159
PCT Pub. Date: Dec. 4, 1986

[30] Foreign Application Priority Data

May 31, 1985 [GB] United Kingdom ............... 8513831

[51] Int. Cl.[4] ........................................... G01R 31/02
[52] U.S. Cl. ................................. 324/540; 324/539
[58] Field of Search ............... 324/541, 540, 539, 66; 379/26

[56] References Cited

U.S. PATENT DOCUMENTS 4,015,200 3/1977 Strandh ........................... 324/540
4,384,249 5/1983 Medina ........................... 324/540
4,418,312 11/1983 Figler et al. ..................... 324/540

FOREIGN PATENT DOCUMENTS 2238936 2/1975 France .
58-30674 2/1983 Japan .
2015754 9/1979 United Kingdom .

OTHER PUBLICATIONS

"Cable Tester" by G. Formica, IBM Technical Disclosure Bulletin, vol. 16, No. 12, (May 1974), pp. 3973-3974.

Primary Examiner—Reinhard J. Eisenzopf
Assistant Examiner—Maura K. Regan
Attorney, Agent, or Firm—Gottlieb, Rackman & Reisman

[57] ABSTRACT

In order to test the leakage between cores of a multicore cable, a test voltage is applied by a first switch in turn to the cores of a cable whose other end is disconnected. A second switch selects the remaining cores in turn and, after each new selection is made by the second switch, the selected core is momentarily connected to a predetermined voltage, e.g., ground or earth potential, by a third switch. This allows the capacitor formed by the two cores to be rapidly charged so that current measuring devices for detecting leakage current do not give spurious readings caused by the charging current. Also, all pair-combinations of the cores may be checked rapidly, allowing cables with large numbers of cores to be tested efficiently.

4 Claims, 1 Drawing Sheet

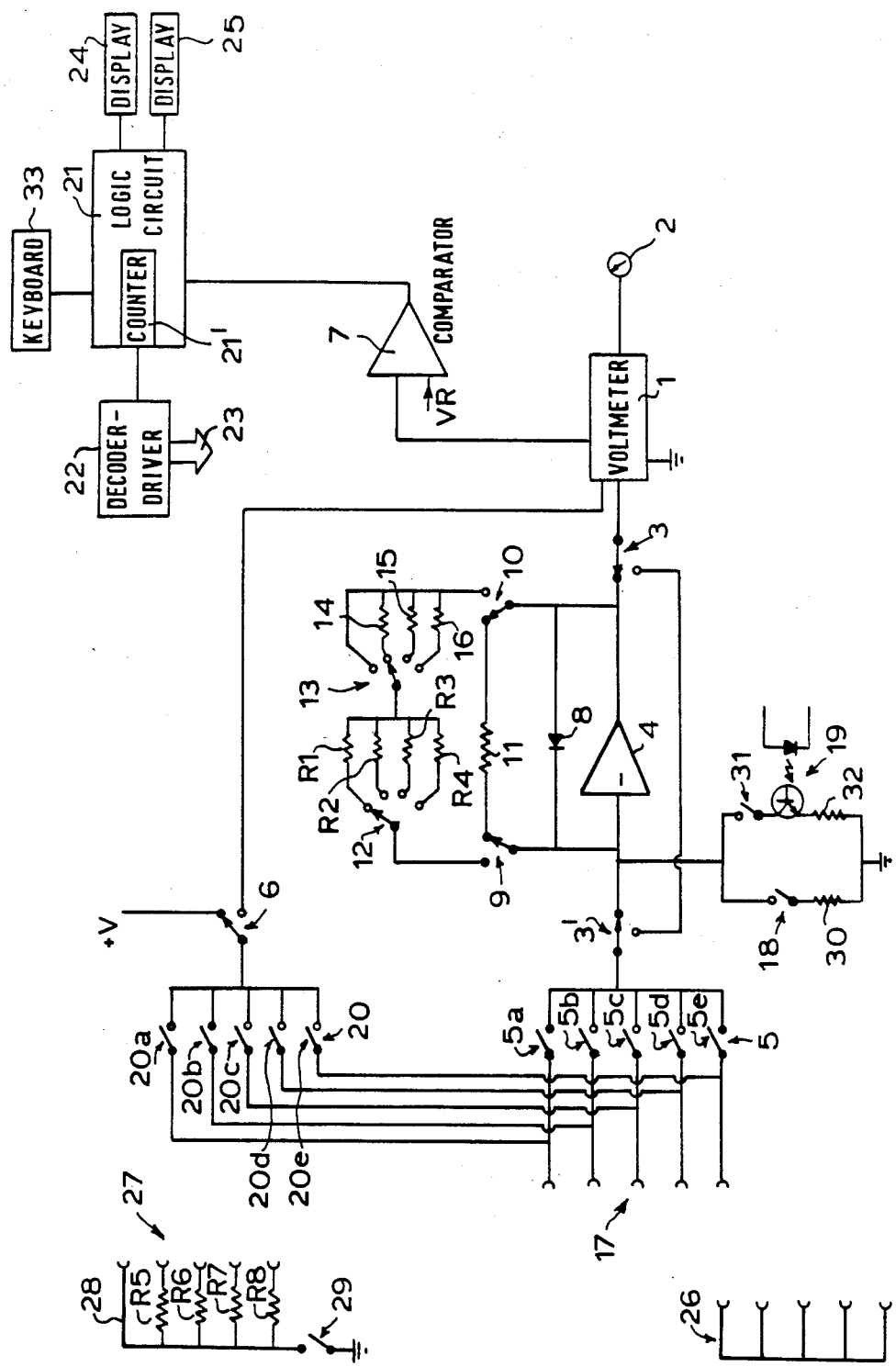

APPARATUSES FOR TESTING MULTI-CORE CABLES FOR LEAKAGE BETWEEN CORES

The present invention relates to apparatuses for testing cables. Such an apparatus is particularly useful for the semi-automatic testing of multicore cables.

According to one aspect of the invention, there is provided an apparatus for testing for leakage between cores of a multicore cable, broadly comprising first means for connection to one end of the cable while the other end of the latter remains disconnected, second means for applying a test voltage through the first means to a first cable core for a predetermined period, third means for connecting and setting each remaining cable core in turn through the first means to a predetermined voltage during an initial portion of the predetermined period and for disconnecting each of the said remaining cable cores in turn from the predetermined voltage at the end of the said initial portion of the predetermined period, and fourth means for detecting current in each of the said remaining cores.

Preferably the first means for applying a test voltage comprises a test voltage source and first switch means for connecting in turn each of at least some of the cable cores to the voltage source through a suitable connector constituting the first means. Preferably the fourth or detecting means comprises an ammeter or a voltmeter and second switch means for connecting in turn each of at least some of the cable cores to the ammeter or voltmeter.

The switch means preferably comprise electrically or electronically operable switches, for instance electromagnetic relays, driven by a counter so as to provide automatic switching of the cores. Preferably means are provided for storing and/or displaying an indication of any cores between which leakage is detected.

Preferably the third setting means comprises third switch means for connecting momentarily the second core to a reference potential, for instance earth. Preferably the third switch means is arranged to be actuated immediately after each actuation of the first or second switch means. The third switch means may comprise an electromagnetic relay whose contact is in parallel with a semiconductor switch, for instance a transistor of an optocoupler or opto-isolator.

When testing for leakage or insulation faults in multicore cables, every combination of pairs of cores must be tested. For a cable comprising N cores, the number of combinations of pairs is $(N-1)+(N-2)+ \ldots +3+2+1=(N^2+N)/2-N$, and manual checking is tedious, laborious, and time-consuming. For a cable of substantial lenght, there is substantial and practically unpredictable capacitance between each pair of cores and, unless care is taken, the effects of this capacitance can upset testing and give rise to spurious and incorrect results.

The apparatus defined above makes it possible to provide automatic or semi-automatic testing of a cable rapidly and reliably. By charging each core fully prior to testing, the cable effects mentioned above are overcome and speed of operation is limited essentially by the period during which the setting means must be allowed to operate in order to permit the core to be reliably charged. The use of a semiconductor switch allows the charging means to begin charging the core very rapidly, and the provision of a parallel relay contact allows charging to be completed beyond the point where, for instance, the finite conduction cut-off collector-emitter voltage would prevent the semiconductor switch from totally charging the core.

According to another aspect of the invention, there is provided an apparatus for testing a multicore cable, comprising a plurality of test resistors of different values and each having a first terminal connected to a common line and a second terminal arranged to be connected to a respective one of at least some of the cable cores at one of the cable, and means for determining whether the resistance between the common line and each of the at least some cores at the other end of the cable is within a predetermined range corresponding to the respective test resistor to which the core is connected.

Preferably the common line is one of the cable cores.

Preferably the determining means comprises a voltage source arranged to be connected to the common line, an operational amplifier, first switch means for connecting in turn each of the at least some cores at the other end of the cable to the inverting input of the operational amplifier, adjustable negative feedback resistance means, second switch means for adjusting the negative feedback resistance means to a value which is a substantially constant ratio to the value of each of the test resistors, and means for determining whether the output voltage of the operational amplifier is equal to a predetermined voltage within a predetermined range. Preferably the constant ratio is 1:2. Preferably each pair of adjacent value test resistors have resistances whose ratio is constant, for instance substantially equal to 1:1.2. Preferably the predetermined range is $\pm 20\%$.

It is thus possible to provide an apparatus for testing the integrity of core connections of a multicore cable. In particular, the apparatus checks whether there is a short circuit between cores or whether the order of connection of cores at one end of the cable differs from that at the other end.

The invention will be further described, by way of example, with reference to the accompanying drawing, which is a schematic circuit diagram of an apparatus constituting a preferred embodiment of the invention.

For the purpose of simplicity and clarity, the apparatus shown in the accompanying drawing is capable of testing multicore cables having five cores. However, in general, practical embodiments of the apparatus will be capable of testing cables having a much larger number of cores, for instance up to twenty cores, up to one hundred cores, or up to any practical number of cores.

The apparatus comprises a voltmeter 1 which is illustrated as having a conventional moving coil analogue meter display 2 but which could include any suitable display. The voltmeter has a first input connected to a switch 3 for selectively connecting the first input to the output of an operational amplifier 4 or to a switch 3' with which the switch 3 is ganged. The switches 3 and 3' thus function as ganged change-over switches and are provided by one or more electronic switches, electromagnetic relays, or any suitable switching means.

The voltmeter 1 has a second input connected to a switch 6. The voltmeter also has an output connected to a comparator 7.

The operational amplifier 4 is provided with a feedback diode 8 which substantially prevents positive voltages appearing at the output of the amplifier. The amplifier is also provided with two different feedback networks selected by a pair of change-over switches 9 and 10 which are operated electrically or electronically and are ganged together. In a first position of the switches 9 and 10, a single feedback resistor 11, for instance having a value of 1 Megohm, is switched into circuit. In the other position of the switches 9 and 10, a network comprising an electrically or electronically actuated switch 12, resistors R1, R2, R3, and R4, a switch 13, and resistors 14, 15, and 16 is selected as the negative feedback loop of the operational amplifier 4.

The inverting input of the amplifier 4 is connected via the switch 3' to the output of a switch 5 which comprises a plurality of electromagnetic relays and contacts 5a–5e. Each relay contact is connectable between the input of the amplifier 4 via the switch 3' and a respective pole of an input connector 17 into which a multicore cable to be tested may be plugged directly or via an adaptor.

The input of the amplifier 4 is also connected to earth by the parallel combination of a first series circuit comprising a switch 18 constituted by a relay and a current-limiting resistor 30, and a second series circuit comprising the collector-emitter path of a transistor forming part of an optocoupler or opto-isolator 19, a switch 31, and a current-limiting resistor 32.

The poles of the connector 17 are also connected to a switch 20 which is of the same type as the switch 5 and comprises relays and relay contacts 20a–20e. The switch 20 is connectable by means of the switch 6 either to a voltage source $+V$ or to the second input of the voltmeter 1.

The output of the comparator 7 is connected to a logic circuit 21 which controls operation of the apparatus by means of a decoder driver circuit 22 which has an output bus 23 for controlling voltmeter 1, the comparator 7, the switches, and the optocoupler 19 and switch 18. The logic circuit 21 also drives two digital seven segment liquid crystal displays 24 and 25. In addition, the logic circuit 21 includes a keyboard 33 for permitting a user to actuate the apparatus so as to perform various tests on the multicore cable.

The elements of the apparatus thus far described are provided in a single housing which, in use, is located at one end of the cable to be tested. In addition, the apparatus comprises two further separate parts for connection to the remote end of the cable in order to perform corresponding tests. The first of these parts comprises a connector 26 into which the remote end of the cable may be plugged either directly or by an adaptor. The poles of the connector 26 are all connected together.

The second part also comprises a connector 27 into which the remote end of the cable may be plugged directly or via an adaptor. One of the poles of the connector 27 is connected by a common line 28 to first terminals of resistors R5, R6, R7, and R8. The other terminals of these resistors are connected to respective poles of the connector 27. A switch 29 allows the common line to be connected to earth.

Operation of the apparatus to test a cable is as follows. The cable is plugged into the connector 17 either directly or via an adaptor and the apparatus is switched on. The number of cable cores is manually programmed into the logic circuit 21 by the keyboard 33. A check is then performed on the cores of the cable to ensure that no voltages are present, as might be the case if the remote end of the cable had not been disconnected for the purpose of testing. Initially, the switch 3 connects the first input of the voltmeter via the switch 3', which isolates the input of the amplifier 4, to the output of the switch 5, the switches 9 and 10 select the resistor 11, and the switches 18 and 20 and the optocoupler 19 are switched off. The logic circuit 21 contains a counter 21' which is reset at switch-on and then counts up to the programmed number of cores. The decoder driver 22 decodes this count and actuates the corresponding one of the relays forming the switch 5 so that the cores of the cable are connected in turn to the input of the voltmeter 1 by the contacts 5a–5e. The decoder driver 22 controls via its output 23 the sensitivity of the voltmeter 1 so that the output signal supplied to the comparator 7 falls within a predetermined usable range of the comparator with respect to a reference voltage VR supplied thereto.

During the initial test, the apparatus checks to see whether any potentially harmful voltage is present between each of the cores and earth and, if any voltage is detected which exceeds a preset value corresponding to the reference voltage VR, the comparator 7 supplies an output signal to the logic circuit 21, which disengages all relay contacts 5a–5e forming the switch 5 so as to prevent damage to the apparatus and provides a warning indication, for instance by means of one or both of the displays 24 and 25, one of which may indicate the core on which the voltage is present. The apparatus remains in this mode until reset by the user after having rectified the potentially harmful situation, in particular by ensuring that both ends of the cable are disconnected from any other apparatus, and the cable is not in contact with another separate cable, for instance in a common cable tray.

If this initial test is satisfactory, then the apparatus checks whether any potentially harmful voltages are present between any pair of the cores of the cable. The switch 6 connects the switch 20 to the second input of the voltmeter so that the voltmeter 1 measures the difference between the voltages on its first and second inputs. The switch 20a connected to a first cable core is closed under control of the logic circuit 21 and the decoder-driver 22, and the switch contacts 5b–5e select in turn each of the other cable cores. The switch contact 20a then opens and the contact 20b closes to select a second cable core and the switch contacts 5c–5e select in turn the remaining cores. This sequencing by the switches 5 and 20 continues until every combination of pairs of the cable cores has been selected, provided no potentially harmful voltage has been detected. If such a harmful voltage is detected, then the relays forming both switches 5 and 20 are disabled so as to prevent damage and an indication is provided to warn the user. For instance, the displays 24 and 25 may indicate the cores between which the voltage has been found. The apparatus remains in this condition until manually reset, again following remedial action to remove the potentially harmful core-to-core voltage.

Following detection of a potentially harmful core-to-earth or core-to-core voltage, resetting of the apparatus may be effective either to start the testing sequence from the beginning or to recheck the combination which gave rise to the harmful condition and then proceed with the remainder of the test sequence. In the first case, the counter or counters within the logic circuit 21 are reset to zero whereas in the second case the counter or counters merely hold their count and are prevented from further counting until manually reset.

Once these two tests have been successfully completed, the apparatus repeats these tests but with the sensitivity of the voltmeter 1 increased so as to detect whether any non-harmful voltage is present between any core and ground or between any pair of cores. If the high-voltage tests were satisfactory, then the further testing for low voltages is necessary so as to prevent erroneous results from the apparatus. During these two lower voltage test procedures, if a voltage is detected, then the sequence is stopped but the relays forming the switches 5 and 20 remain operative so that the value of the voltage may be read from the voltmeter display 2. The user is required to rectify the condition and the test sequence then proceeds either manually or automatically once the voltage has been removed or upon manual resetting of the apparatus. As soon as the lower voltage tests have been completed, the logic circuit 21 causes the apparatus to enter a waiting mode until one of the cable testing modes is manually selected by means of the keyboard 33.

The apparatus provides three testing modes, namely for continuity of the cores, for leakage or faulty insulation between cores or between a core and earth, and for short circuits between cores or incorrect connection of the cores to connectors. Each of these three modes will now be described in more detail.

When the core continuity mode is selected, it is necessary for the connector 26 to be connected to the remote end of the cable. When this has been done, the logic circuit 21 and decoder-driver 22 control the switches 6 and 20 so that the voltage +V is supplied to one of the cores. For instance, the contact 20a is closed and the contacts 20b–20e remain open. The switches 3 and 3' connect the first input of the voltmeter 1 to the switch 5. The logic circuit 21 and decoder-driver 22 then cause the switch 5 to connect in turn each of the other cable cores by sequentially closing and opening the contacts 5b–5e, the contact 5a remaining open, and the voltage on each core is measured by the voltmeter 1. The voltmeter 1 supplies a suitably scaled output signal to the comparator 7 so that, in the presence of the correct voltage, the voltage supplied to the comparator 7 exceeds the reference voltage VR and the comparator 7 supplies a signal to the logic circuit 21 indicating that the core under test has an acceptable continuity. In the event of a break in the core or the presence of a relatively high resistance because of a damaged or faulty connection or core conductor such that the voltage supplied to the comparator 7 is less than the reference voltage VR and the comparator 7 is not actuated, the logic circuit halts the sequencing by the switch 5 and indicates on the display 25 which core is faulty. Should there be a fault condition during the first test step, then there is a minor ambiguity in that either the core connected to the switch contact 20a or the core connected to the switch contact 5b may be faulty. In this case, the display 24 is also actuated. The user may then reset the apparatus manually to continue checking the remainder of the cores for continuity. Alternatively, the apparatus may check each of these cores in combination with another to try to resolve the ambiguity.

In order to perform the leakage and insulation test, the remote end of the cable is disconnected manually so as to prepare for the test. The leakage and insulation test mode is then manually selected and the logic circuit 21 controls the switch 6 so that the test voltage +V is supplied to the switch 20. The switch 3 connects the voltmeter 1 to the output of the amplifier 4, the switch 3' connects the switch 5 to the input of the amplifier 4, the switch 31 is closed, and the switches 9 and 10 select the resistor 11. The switch 20 then supplies the test voltage to one of the cores of the cable via the connector 17, for instance by closing the contact 20a while the contacts 20b–20e remain open, and the logic circuit 21 controls the switch 5 so that it cycles through the remaining cores, for instance by closing then opening the contacts 5b–5e in turn. Thus the switch contact 20a is closed to select a first core and the switch contact 5b is initially closed to select a second core. During selection by the switch 5 and/or 20, the optocoupler 19 and the switch 18 are actuated by the decoder driver so as to connect momentarily the selected core to earth. This allows the capacitance between the cores to be charged rapidly via a low impedance path, so that the core connected to the switch 5 is set to a predetermined, for instance earth, potential. Conduction of the transistor of the optocoupler 19 occurs almost instantaneously so that the level of charge is reduced until the voltage between the core and earth falls to the collector-emitter Cut-off voltage at which the transistor stops conducting. It takes longer for the switch 18 to close but, when it does, it ensures that the capacitance is fully charged. The combination of the optocoupler 19 and the switch 18 substantially increases the speed with which the core can be charged.

The output voltage of the amplifier 4, which is effectively functioning as a current-to-voltage converter or as a very high gain voltage amplifier, provides an indication of any leakage or inadequate insulation between the cores selected by the switches 5 and 20. The voltmeter 1 supplies a corresponding voltage signal to the comparator 7 and, if there is any substantial leakage, the logic circuit 21 is signalled by the comparator 7 and halts sequencing by the switches 5 and 20. The cores being tested are indicated by the displays 24 and 25, and the degree of leakage is indicated by the voltmeter display 2. The apparatus may then be reset manually so as to continue sequencing through the cores. Thus, the switch contact 5b opens and the contact 5c closes to select core three and the optocoupler 19 and switch 18 are momentarily actuated. The switch 5 then selects cores four and five in turn so as to complete its sequence with respect to core one. The switch contact 20a then opens and the contact 20b closes to select core two and the switch contacts 5c–5e are closed in turn to select cores three to five in sequence. Each time the switch 5 selects a different core, the optocoupler 19 and the switch 18 are momentarily actuated. As soon as all combinations of pairs of cores have been tested, the apparatus returns to a waiting mode.

As an alternative to the sequencing of cores during the leakage test described above, the following sequencing may be performed and has advantages where a very large number of cores are being tested. The contact 20a is closed to supply the voltage +V to core one and the contacts 5b–5e are simultaneously closed so that any leakage between core one and any of the other cores is detected. If an unacceptable amount of leakage is detected, the contacts 5b–5e are then opened and closed in turn to determine the pair of cores between which leakage is taking place. Otherwise the contact 20a is opened, the contact 20b is closed, and the contacts 5c–5e (or possibly the contacts 5a and 5c–5e) are simultaneously closed. This procedure is then repeated until the leakage test has been completed.

By testing for leakage between each core and all other cores (or remaining cores) simultaneously, the number of tests can be substantially reduced, compared with testing between every combination of core pairs, for cables with no, or only very few, leakage faults.

Since it is relatively rare for there to be many leakage faults in a cable, the time taken by leakage testing is substantially reduced.

The switching sequences followed by the switches 5 and 20 may be reversed. For instance, in the case where each core is tested for leakage to all other cores the sequence may start with the contact 5a closed and the contacts 20b-20e closed so that the voltage +V is supplied simultaneously to cores two to five and leakage to core one is tested.

A high voltage leakage test may be performed, for instance where +V =500 volts, provided the electronic circuitry is properly protected. For this purpose, the switch 31 is opened so as to protect the opto-isolator 19 and a high voltage sensing circuit (not shown) is incorporated within or in place of the circuit comprising the op-amp 4 and associated components and the voltmeter 1.

In order to select the sequence mode, the remote end of the cable is plugged into the connector 27 either directly or via an adaptor. The logic circuit 21 then disables the switches 18 and 31 and the optocoupler 19, and causes the switches 9 and 10 to select the feedback network comprising the switches 12 and 13, the resistors R1 to R4, and the resistors 14 to 16. The voltmeter 1 remains connected via the switch 3 to the output of the amplifier 4 whose input remains connected via the switch 3' to the switch 5.

The values of the resistors R5 to R8 are selected such that the ratio of R5 to R6 is equal to the ratio of R6 to R7 and to the ratio of R7 to R8. This ratio may, for instance, be 1:1.2. In practice, strict equality to this ratio is not essential, and the actual nominal value of this ratio may also be different.

Each of the resistors R1 to R4 has a value substantially equal to a common fraction of the value of the corresponding resistor R5 to R8, respectively, i.e. R5/R1 =R6/R2 =R7/R3 =R8/R4. This fraction is preferably a half, but other fractions would also be possible. In a specific embodiment employing forty test resistors and forty feedback resistors, the particular values used were as set out in the appended table.

The switch 13 and the resistors 14 to 16 are provided so as to equalise the line resistance of the cores where this is significant in comparison with the smaller-value test resistors connected to the connector 27. The value of the resistor selected by the switch 13 may be determined manually by measuring the resistance of one of the cores and selecting one of the resistors 14 to 16 having a value approximately equal to half of this in the case where each feedback resistor is equal to half of the value of the corresponding test resistor.

In the preferred embodiment, the voltmeter display 2 is provided with 50 evenly spaced calibrations. When the sequence test has been selected, the test voltage +V is supplied via the switch 6, the switch contact 20a and the first cable core to the common line 28. The switch contacts 5b-5e then select sequentially the other cores and the switch 12 sychronously connects the corresponding resistors R1 to R4 in the feedback loop of the amplifier 4. In the absence of a fault condition, the voltmeter display 2 provides a reading which is within plus and minus 10 calibration points of half scale to indicate absence of a fault. However, if a reading outside this range is obtained from the display 2, this is indicative of a fault, for instance two cores shorted together or crossed-over cores. If full automation of the sequence test is required, the logic circuit 21 and the decoder-driver 22 cause the comparator to function as a window comparator which, if it receives a signal outside the above range, supplies a signal to the logic circuit 21 which suspends sequencing of the switch contacts 5b-5e until manual resetting allows sequencing to continue.

A modified form of the sequence mode may be used, for instance where the cable cores may have been crossed between the cable ends or where the core which is connected to the common line 28 cannot be visually identified at the other end of the cable. Initially, the connector 27 is connected to the remote cable end and the switch 29 is closed so as to earth the common line 28. The contacts 20a-20e and the contacts 5a-5e, respectively, are closed in turn to determine the resistance through cores one to five, respectively, to ground. The core connected to the common line 28 exhibits a resistance which is equal to the line resistance plus earth resistance and which is the lowest of all measured resistances. Both ends of the core may therefore be identified and, for the succeeding core identification test, the voltage +V is supplied to this core by the corresponding one of the contacts 20a-20e. The switch 29 is opened to disconnect the common line 28 from earth and the switch 13 is operated, manually or automatically, to select one of the resistors 14-16 to compensate for the line resistance i.e. the resistance of each core.

In order to identify the cores, the switch 12 first selects the resistor R1. The switch contacts 5a-5e (possibly excluding that connected to the core to which the voltage +V is supplied) are closed in sequence until the comparator 7 signals to the logic circuit 21 that the measured voltage is within the predetermined window. The display 24 indicates the core end at the apparatus which corresponds to the core end at the connector 27 connected to the resistor R5. The logic circuit then awaits a manually entered command to continue from the keyboard 33 before identifying the next core end. Alternatively, if means are provided for automatically storing the identity of the core, the logic circuit then automatically identifies the next core.

The next core is identified by causing the switch 12 to select the resistor R2 and by sequentially closing those of the contacts 5a-5e which are connected to cores which have not yet been identified. This process is repeated until all of the cores have been identified so that the locations of the ends of each core at the ends of the cable are known. Any crossed or incorrectly wired cores may thus readily be identified.

Various modifications may be made within the scope of the invention. For instance, the logic circuit 21 may be provided with manually operable control means for permitting the various sequencing to be performed under manual control ("one-shot" operation). A memory may be provided for storing indications of faults together with indications of faulty cores for subsequent analysis. The logic circuit 21 and the decoder-driver 22 may be made from discrete logic or may include or be embodied by a microprocessor or the like.

| Test Resistor Value (Ohms) | Feedback Resistor Value (Ohms) |
|---|---|
| 1650 | 825 |
| 2K | 1K |
| 2.37K | 1.21K |
| 2.87K | 1.43K |
| 3.4K | 1.69K |
| 4.12K | 2.05K |
| 4.99K | 2.49K |

-continued

| Test Resistor Value (Ohms) | Feedback Resistor Value (Ohms) |
| --- | --- |
| 5.9K | 3.01K |
| 7.15K | 3.57K |
| 8.66K | 4.32K |
| 10.5K | 5.23K |
| 12.7K | 6.34K |
| 15.4K | 7.68K |
| 18.7K | 9.31K |
| 22.6K | 11.3K |
| 26.7K | 13.3K |
| 31.6K | 15.8K |
| 37.4K | 18.7K |
| 44.2K | 22.1K |
| 53.6K | 26.7K |
| 64.9K | 32.4K |
| 78.4K | 39.2K |
| 95.3K | 47.5K |
| 115K | 57.6K |
| 187K | 68.1K |
| 165K | 82.5K |
| 191K | 97.6K |
| 226K | 113K |
| 267K | 133K |
| 316K | 158K |
| 374K | 187K |
| 442K | 221K |
| 523K | 261K |
| 624K | 316K |
| 768K | 383K |
| 931K | 464K |
| 562K + 562K | 562K |
| 681K + 681K | 681K |
| 825K + 825K | 825K |
| 1 M + 1 M | 1 M |

I claim:

1. An apparatus for testing for leakage between cores of a multicore cable having a first end which is connected to said apparatus during testing and a second end which is disconnected during testing, said apparatus comprising:

first means for connection to the first end of the multicore cable;

second means for applying via said first means a test voltage to each of a plurality of first groups of the cores in turn for a predetermined period, each of the first groups of cores comprising at least one core;

third means for connecting to a predetermined voltage via said first means each of a plurality of second groups of the cores in turn during an initial portion of the predetermined period and for disconnecting each of the second groups of cores from the predetermined voltage at the end of the initial portion of the predetermined period, each of the second groups of cores comprising at least one core; and fourth means for detecting current via said first means in each of the second groups of cores in turn during a portion of the predetermined period subsequent to the initial portion.

2. An apparatus as claimed in claim 1, in which said second means for applying a test voltage comprises a test voltage source, and first switch means for connecting said at least one core of each of said first groups of cores in turn to the test voltage source.

3. An apparatus as claimed in claim 1, in which said fourth means for detecting current comprises a current measuring meter, and second switch for connecting said at least one core of each of said second groups of cores in turn to the current measuring meter.

4. An apparatus as claimed in claim 3, in which said third means comprises third switch means connected to said second switch means between the latter and said current measuring meter for connecting momentarily the output of said second switch means to the predetermined voltage after said second switch means connects each said at least one core of each of said second groups of cores to the current measuring means.

* * * * *